United States Patent [19]

Crookshanks

[11] Patent Number: 4,783,632
[45] Date of Patent: Nov. 8, 1988

[54] MULTI-ARM FREQUENCY SWEEP GENERATOR

[75] Inventor: Rex J. Crookshanks, Palos Verdes Estates, Calif.

[73] Assignee: Hughes Aircraft Company, Los Angeles, Calif.

[21] Appl. No.: 881,742

[22] Filed: Jul. 3, 1986

[51] Int. Cl.[4] .................. H03B 1/04; H03B 23/00
[52] U.S. Cl. .................. 328/103; 342/201; 328/27; 328/163
[58] Field of Search .................. 328/103, 104, 27, 163; 342/132, 201

[56] References Cited

U.S. PATENT DOCUMENTS

| | | | |
|---|---|---|---|
| 3,579,117 | 5/1971 | Norris | 328/104 |
| 3,639,842 | 2/1972 | Zarcone et al. | 328/104 |
| 4,197,540 | 4/1980 | Riggs et al. | 342/201 |
| 4,359,736 | 11/1982 | Lewis | 342/201 |
| 4,404,562 | 9/1983 | Kretschmer et al. | 342/132 |

OTHER PUBLICATIONS

R. C. Williamson and H. I. Smith, "The Use of Surface-Elastic-Wave Reflection Gratings in Large Time-Bandwidth Pulse-Compression Filters," *I.E.E.E. Transactions on Microwave Theory and Techniques*, vol. MTT-21, No. 4, Apr. 1973, pp. 195–205.

Primary Examiner—John S. Heyman
Attorney, Agent, or Firm—S. M. Mitchell; M. J. Meltzer; A. W. Karambelas

[57] ABSTRACT

A multi-arm frequency sweep generator 10 provides frequency sweep characterized by precise waveform control (linearization), steep slopes, and a high repetition rate. An impulser (12) generates pulses which are distributed by a multiplexer (14) to the multi-arms of the frequency sweep generator. Each arm includes a reflective array compressor (RAC) 16 for dispersion a throughgoing pulse into a frequency sweep of low enough slope that it can be effective corrected by means of complex multiplying digital-to-analog converters (18). The corrected sweeps are summed by a demultiplexer (20). A compressor RAC (22) compresses the summed output to provide sweeps with slopes steeper than would normally be correctable by the MDACs.

7 Claims, 2 Drawing Sheets

MULTI-ARM FREQUENCY SWEEP GENERATOR

BACKGROUND OF THE INVENTION

The present invention relates to frequency sweeps, and, more particularly, to a multi-arm frequency sweep generator operating at radio frequency.

Many communication devices utilize frequency sweeps, e.g., demodulators, swept receivers and spectrum analyzers. A frequency sweep is a waveform with a monotonic frequency function of time. Typically, linear frequency sweeps are desired.

Frequency sweeps can be generated by time dispersing a pulse as a function of frequency. The pulse is selected to have frequency components over the desired output range of the sweep.

A reflective array compressor (RAC) is one device used to produce such dispersion. The RAC may be manufactured by etching plural slits in a large quartz crystal. The size and placement of the slits determine the dispersion characteristics of the RAC. For example, a RAC can be designed to provide a linear or other specific sweep. RACs are well-known in the art and are described for example in "The Use of Surface-Elastic Wave Reflection Gratings in Large Time-Bandwidth Pulse Compression Filters", R. C. Williamson et al, I.E.E.E. Transactions on Microwave Theory and Techniques, Vol. MTT-21, No. 4, April, 1973, pp. 195–205.

In one application, a surface acoustic wave (SAW) demodulator can incorporate three or three sets of RACs. The input to the demodulator can be a frequency division multiple access (FDMA) signal. For each symbol or bit period of the FDMA signal, a first or input RAC time-staggers the individual frequency bands that make up the multiplexed signal. A second frequency sweep RAC converts pulses, synchronized to the input bit periods, to sweeps. The sweeps are combined with the staggered frequency channels to produce a series of sweeps. A third or output RAC compresses these sweeps into pulses which represent the time division multiplexed (TDM) decoding of the FDMA input.

While RACs perform quickly and reliably, they are difficult to manufacture precisely. A RAC designed to produce a linear frequency sweep, for example, will generally have some characteristic non-linearities. The cost of manufacturing each RAC typically prohibits large scale rejection of deviating devices. In addition, the characteristics of a RAC can change due to temperature. For RACs to be used in environments such as space with temperature extremes, it is desirable to be able to calibrate a RAC to maintain linearity.

In many applications, an error signal can be obtained which when zeroed indicates a linear frequency sweep. More specifically, a sweep can be applied to a known input signal, and the result compared to the expected output. In the SAW demodulator described above, a constant known input should produce a series of pulses with very little spreading. Any spreading can be analyzed as a function of frequency to identify points of non-linearity in the frequency sweep and allow for correction.

However, in applying corrections device encounter performance constraints which limit the slope and repetition rate of sweeps that can be corrected reliably. Device technology continues to ease these limits, but desired objectives remain distant. What is needed is an approach that can greatly extend the frequency slopes and repetition rates that can be reliably corrected with current technology.

SUMMARY OF THE INVENTION

In a novel multi-arm frequency sweep generator, successive sweep triggering pulses are demultiplexed and distributed among multiple arms, each arm having a RAC and a correcting means, advantageously, a complex multiplying digital-to-analog converter (MDAC). The corrected sweeps are summed. A second RAC or other sweep compressor means determines adjusts the final slope of the sweeps.

The compressor RAC can advantageously operate in opposition to the dispersion RACs. Thus, the dispersion RACs can generate sweeps with slopes less than that desired in the output sweeps. The greater slopes of the intermediate sweeps provide for ready correction by the MDACs. Following correction, the intermediate sweep slopes can be increased by the compressor RAC to the desired level. The resulting sweeps can be overlapping or non-overlapping, as desired.

Thus, in accordance with the present invention, a series of accurate calibrated sweeps can be generated at a high repetition rate over a wide range of slopes.

DESCRIPTION OF THE PREFERRED EMBODIMENTS

Figure 1:
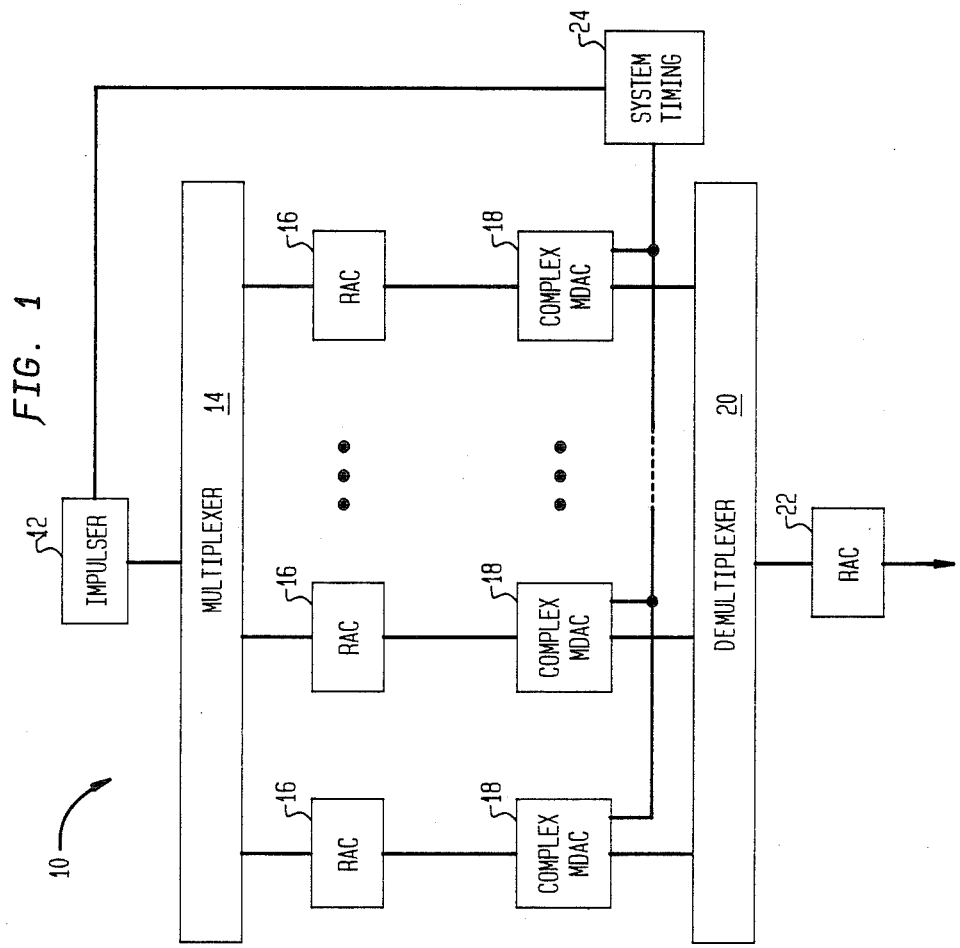
FIG. 1 is a block diagram of a many-arm frequency sweep generator in accordance with the present invention.
Figure 4:
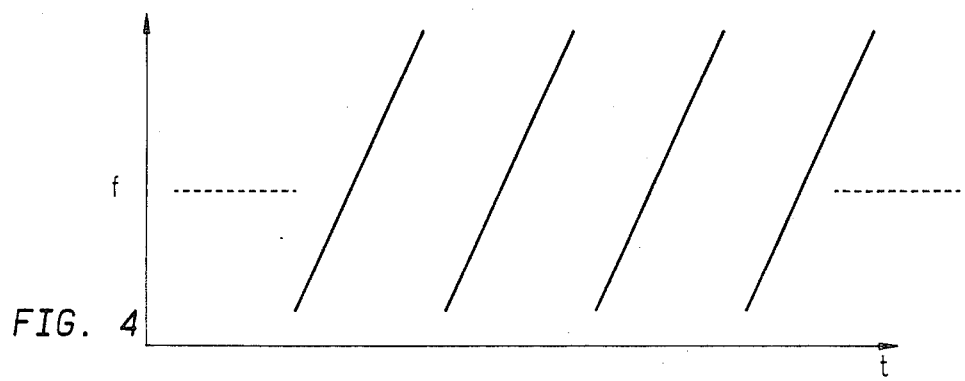
FIG. 4 is a frequency-time waveform chart of the output of the frequency sweep generator of FIG. 1.

A many-arm frequency sweep generator 10, illustrated in FIG. 1, provides a series of sweeps such as those shown in FIG. 4. The sweep generator 10 includes an impulser 12 or other pulse source, a conventional multiplexer such as a Fairchild chip No. 54F/74F151A 14 or other pulse distribution means for distributing 25 pulses among the multiple arms of the many-arm frequency sweep generator 10. Each arm includes a RAC 16, serving as a pulse-dispersion means, and a complex MDAC 18 serving as a correction means. The sweep outputs of the multi-arms are summed in a conventional demultiplexer 20 such as a Fairchild chip No. 54F/74F138. The summed intermediate sweeps are processed by a compressor RAC 22 or other sweep compression means means to provide the desired output.

Figure 2:
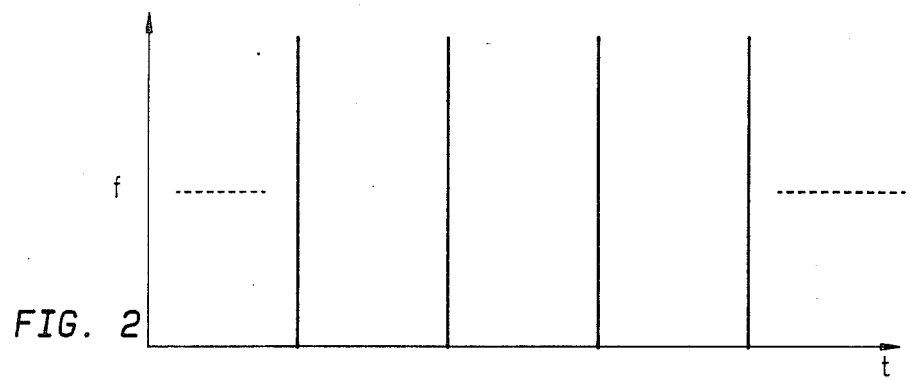
FIG. 2 is a frequency-time waveform chart of the output of an impulser of the sweep generator of FIG. 1.

The impulser 12 generates pulses in response to system timing signals, indicated at 30. The output of the impulser 12 is shown in FIG. 2. Each pulse includes frequency components throughout the bandwidths of the dispersion RACs 16 and the compressor RAC 22. Pulse components outside these bandwidths are effectively filtered out by the RACs. The multiplexer 14 serves to distribute successive pulses to respective dispersion RACs 16.

Figure 3:
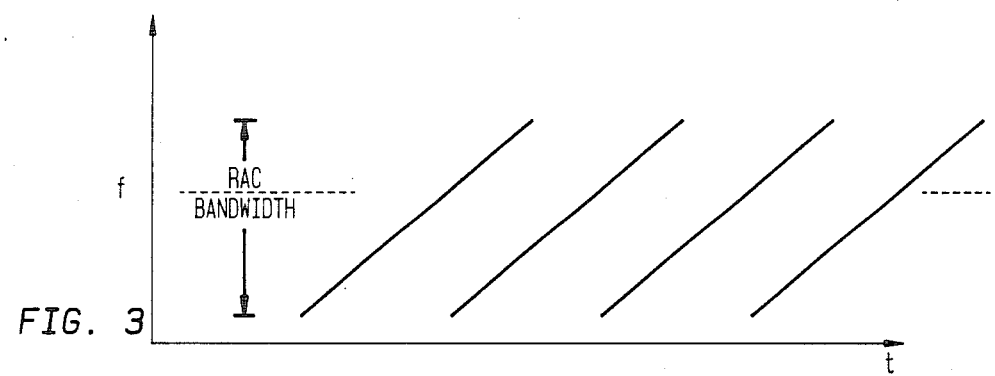
FIG. 3 is a frequency-time waveform chart of an intermediate sweep series of the frequency sweep generator of FIG. 1.

Each dispersion RAC 16 disperses its input pulse into a sweep of frequency as a function of time. The illustrated dispersion RACs 16 are down-chirp RACs, which means they delay lower frequency components of a pulse more than the higher frequency components. The effect of an illustrated down-chirp dispersion RAC 16 is indicated by the slope of any individual sweep in FIG. 3, which illustrates the summed output of the multiplexer 20.

The illustrated compressor RAC 22 is an up-chirp RAC in that it delays higher frequency signals more than lower frequency signals. Its effect is opposed to and relatively less than that of the dispersion RACs 16 so that the latter's effect is partially offset. The output of the many-arm frequency sweep generator 10 is a series of non-overlapping frequency sweeps, as illustrated in FIG. 4. However, an overlapping output is provided for by a lesser compression or a higher repetition rate.

An important motivation for first creating an intermediate sweep of lesser slope is the performance limitations of corrections means, such as MDACs (multiplying digital-to-analog converter) which are devices well-known in the art. The illustrated MDACs 18 are designed to correct for nonlinearities or other distortions in the output of the sweep generator by transforming the intermediate sweep according to a predetermined function.

More particularly, each complex MDAC effectively divides each sweep into a multitude of time-based segments, and multiplies each such segment by a respective predetermined complex number. The effect of the complex multiplication is to adjust the amplitude and phase of each sweep segment in accordance with a predetermined correction function. Basically, the function is selected to correct actual distortions introduced by the respective dispersion RAC and to cause predistortions to compensate for distortions to be introduced by the compressor RAC.

MDAC performance can be limited by throughput and the necessity of synchronizing with the sweep to be corrected. If a sweep is of too short duration, the performance parameters of the MDAC can be exceeded. In other words, corrections might be applied to the wrong segments of the sweep. The illustrated embodiment provides an intermediate sweep of duration within the performance parameters of the MDACs 18. After the correction is applied, the desired high output slope is provided by the compressor RAC 22.

In accordance with the foregoing, a correctable frequency sweep generator with enhanced capability for producing frequency sweeps with steep slopes and at high repetition rates. Many modifications and variations of the present invention are contemplated, including different sweep forms, pulse sources, pulse distributing means, dispersion means, and correcting means. Therefore, the present invention is defined only by the scope of the following claims.

What is claimed is:
1. A frequency sweep generator comprising:
a source of a series of pulses;
plural dispersion means for introducing delays into a pulse as a function of frequency to produce a frequency sweep which includes at least some deviations from a desired, preselected frequency sweep;
means for distributing said pulses among said plural dispersion means;
sweep correction means associated with each dispersion means for applying predetermined corrections to the output of the associated dispersion means to correct the deviations in the frequency sweep produced by said plural disperion means whereby to obtain said desired frequency sweep; and
summing means for combining the outputs of said plural dispersion means.

2. The frequency sweep generator of claim 1 further comprising a compressor means for introducing delays as a function of frequency into the output of said summing means.

3. A method of producing a rapid series of waveform corrected steep frequency sweeps comprising the steps of:
generating a series of pulses;
distributing the pulses cyclically to plural paths;
dispersing each pulse in each path by introducing delays in the pulse as a function of frequency to provide a frequency sweep from each pulse which includes at least some deviations from a desired frequency sweep;
applying a time-varying correction function to each frequency sweep so generated to correct the deviations in the frequency sweep; and
summing the corrected frequency sweeps.

4. The method of claim 3 further comprising the step of compressing the summed corrected frequency sweeps to achieve a desired output slope.

5. The method of claim 4, wherein the step of compressing is performed by introducing delays as a function of frequency into the summed corrected frequency sweeps.

6. The method of claim 3, further comprising the step of partially offsetting the delays introduced into the pulses during the dispersing step, after the corrected frequency sweeps have been summed.

7. The method of claim 3, further comprising the step of compressing the summed corrected frequency sweeps to achieve a desired slope, the compressing step resulting in the introduction of distortions into the compressed, summed frequency sweeps, and the step of applying a correction function includes precompensating for said distortions.

* * * * *